(12) United States Patent
Tinnemans et al.

(10) Patent No.: US 8,817,235 B2
(45) Date of Patent: Aug. 26, 2014

(54) LITHOGRAPHIC APPARATUS AND METHOD INVOLVING A POCKELS CELL

(75) Inventors: Patricius Aloysius Jacobus Tinnemans, Hapert (NL); Johannes Jacobus Matheus Baselmans, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 584 days.

(21) Appl. No.: 12/436,604

(22) Filed: May 6, 2009

(65) Prior Publication Data

US 2009/0279066 A1  Nov. 12, 2009

Related U.S. Application Data

(60) Provisional application No. 61/071,622, filed on May 8, 2008.

(51) Int. Cl.
*G03B 27/72* (2006.01)
*G03B 27/54* (2006.01)
*G03B 27/32* (2006.01)

(52) U.S. Cl.
USPC .................................. 355/71; 355/67; 355/77

(58) Field of Classification Search
CPC . G03F 7/70308; G03F 7/702; G03F 7/70575; G03F 7/70566; G03F 7/70108; G03F 7/70116; G03F 7/70091; G03F 7/70125; G03F 7/70191
USPC .................................. 355/67, 71, 77
See application file for complete search history.

(56) References Cited

U.S. PATENT DOCUMENTS

| | | | |
|---|---|---|---|
| 5,815,247 A * | 9/1998 | Poschenrieder et al. | 355/71 |
| 6,031,946 A | 2/2000 | Bergmann et al. | |
| 6,970,233 B2 | 11/2005 | Blatchford | |
| 7,095,481 B2 | 8/2006 | Morohoshi | |
| 7,342,644 B2 * | 3/2008 | Baselmans et al. | 355/69 |
| 7,391,499 B2 | 6/2008 | Schmidt | |
| 8,081,295 B2 * | 12/2011 | Goehnermeier | 355/71 |
| 2004/0053148 A1 | 3/2004 | Morohoshi | |
| 2004/0108467 A1 * | 6/2004 | Eurlings et al. | 250/492.1 |
| 2005/0128458 A1 | 6/2005 | Blatchford | |
| 2005/0264885 A1 * | 12/2005 | Albert | 359/489 |
| 2006/0050261 A1 * | 3/2006 | Brotsack | 355/71 |
| 2006/0055834 A1 * | 3/2006 | Tanitsu et al. | 349/5 |

(Continued)

FOREIGN PATENT DOCUMENTS

| | | |
|---|---|---|
| JP | 2002-353105 | 12/2002 |
| JP | 2004-111579 | 4/2004 |

(Continued)

OTHER PUBLICATIONS

Japanese Office Action dated Jun. 7, 2011 in corresponding Japanese Patent Application No. 2009-108622.

*Primary Examiner* — Peter B Kim
*Assistant Examiner* — Michelle Iacoletti
(74) *Attorney, Agent, or Firm* — Pillsbury Winthrop Shaw Pittman LLP

(57) ABSTRACT

A lithographic apparatus is disclosed that includes an illumination system configured to condition a beam of radiation, the illumination system having a Pockels cell arranged to control the polarization of the radiation beam, and an array of individually controllable reflective elements arranged to control the pupil plane distribution of the radiation beam.

20 Claims, 6 Drawing Sheets

(56) References Cited

U.S. PATENT DOCUMENTS

| | | |
|---|---|---|
| 2006/0119825 A1 | 6/2006 | Munnig Schmidt |
| 2007/0013890 A1 | 1/2007 | Loopstra et al. |
| 2008/0013065 A1 | 1/2008 | Kohl |
| 2009/0135397 A1* | 5/2009 | Fiolka .............................. 355/71 |

FOREIGN PATENT DOCUMENTS

| | | |
|---|---|---|
| JP | 2005-167254 | 6/2005 |
| JP | 2006-165548 | 6/2006 |
| JP | 2007-180088 | 7/2007 |
| JP | 2008-60546 | 3/2008 |

\* cited by examiner

LITHOGRAPHIC APPARATUS AND METHOD INVOLVING A POCKELS CELL

This application claims priority and benefit under 35 U.S.C. §119(e) to U.S. Provisional Patent Application No. 61/071,622, entitled "Lithographic Apparatus and Method", filed on May 8, 2008. The content of that application is incorporated herein in its entirety by reference.

FIELD

The present invention relates to a lithographic apparatus and method.

BACKGROUND

A lithographic apparatus is a machine that applies a desired pattern onto a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto an exposure area (e.g. comprising part of, one or several dies) on a substrate (e.g. a silicon wafer) that has a layer of radiation-sensitive material (resist). In general, a single substrate will contain a network of adjacent exposure areas that are successively exposed. Known lithographic apparatus include so-called steppers, in which each exposure area is irradiated by exposing an entire pattern onto the exposure area in one go, and so-called scanners, in which each exposure area is irradiated by scanning the pattern through the beam in a given direction (the "scanning"-direction) while synchronously scanning the substrate parallel or anti-parallel to this direction.

There is an ongoing desire in the lithography industry to provide improved control of the polarization and/or the pupil plane distribution of radiation projected onto a substrate (these properties are sometimes referred to in combination as being the illumination mode of the radiation). It is desirable to provide a lithographic apparatus and method which allows this to be achieved.

SUMMARY

According to an aspect of the invention, there is provided a lithographic apparatus comprising an illumination system for providing a beam of radiation, a support structure for supporting a patterning device, the patterning device serving to impart the radiation beam with a pattern in its cross-section, a substrate table for holding a substrate, and a projection system for projecting the patterned radiation beam onto the substrate, wherein the illumination system comprises a Pockels cell arranged to control the polarization of the radiation beam, and an array of individually controllable reflective elements arranged to control the pupil plane distribution of the radiation beam.

According to an aspect of the invention, there is provided an illumination system of a lithographic apparatus comprising a Pockels cell arranged to control the polarization of the radiation beam, and an array of individually controllable reflective elements arranged to control the pupil plane distribution of the radiation beam.

According to an aspect of the invention, there is provided a lithographic method comprising providing a beam of radiation, modifying the polarization of the radiation beam using a Pockels cell, applying a pupil plane distribution to the beam of radiation using an array of individually controllable elements, patterning the radiation beam using a patterning device, and projecting the patterned radiation beam onto a substrate using a projection system.

The method may comprise switching from a first polarization and first pupil plane distribution to a second polarization and second pupil plane distribution during exposure of an exposure area on the substrate.

The beam of radiation may be pulsed, and the switching of polarization and pupil plane distribution may occur after each pulse of the radiation beam. Alternatively, the switching of polarization and pupil plane distribution may occur after a certain number of pulses of the radiation beam.

The method may further comprise performing double patterning via double exposure, with the switching of polarization and pupil plane distribution occurring after patterning the radiation beam using a first pattern and before patterning the radiation beam using a second pattern.

The switching of polarization and pupil plane distribution may be arranged such that a first part of the exposure area receives radiation having the first polarization and first pupil plane distribution and a second part of the exposure area receives radiation having the second polarization and second pupil plane distribution.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1A:
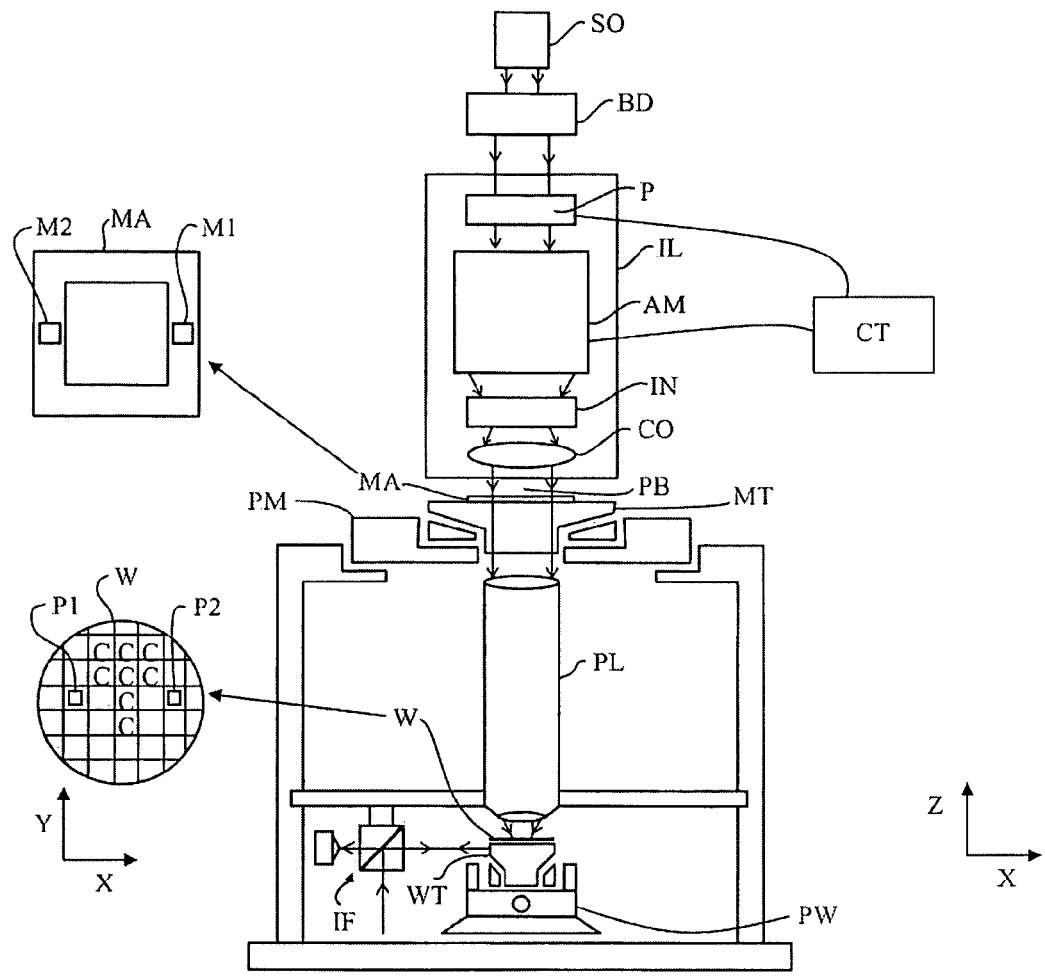
FIGS. 1a and 1b schematically depict a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "exposure area", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm).

The term "patterning device" used herein should be broadly interpreted as referring to a device that can be used to impart a radiation beam with a pattern in its cross-section such as to create a pattern in an exposure area of the substrate. It should be noted that the pattern imparted to the radiation beam may not exactly correspond to the desired pattern in the exposure area of the substrate. Generally, the pattern imparted to the radiation beam will correspond to a particular functional layer in a device being created in the exposure area, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may be of a type which allows rapid switching between two or more masks (or between patterns provided on a controllable patterning device), for example as described in United States patent application publication no. US 2007-0013890A1.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

FIG. 1a schematically depicts a lithographic apparatus according to a particular embodiment of the invention. The apparatus comprises:
 an illumination system (illuminator) IL to condition a radiation beam PB of radiation (e.g. UV radiation or EUV radiation);
 a support structure (e.g. a support structure) MT to support a patterning device (e.g. a mask) MA and connected to first positioning device PM to accurately position the patterning device with respect to item PL;
 a substrate table (e.g. a wafer table) WT to hold a substrate (e.g. a resist-coated wafer) W and connected to second positioning device PW to accurately position the substrate with respect to item PL; and
 a projection system (e.g. a refractive projection lens) PL configured to image a pattern imparted to the radiation beam PB by patterning device MA onto an exposure area C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The support structure MT holds the patterning device. It holds the patterning device in a way depending on the orientation of the patterning device, the design of the lithographic apparatus, and other conditions, such as for example whether or not the patterning device is held in a vacuum environment. The support structure MT can use mechanical clamping, vacuum, or other clamping techniques, for example electrostatic clamping under vacuum conditions. The support structure MT may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL is described further below.

Upon leaving the illuminator IL, the radiation beam PB is incident on the patterning device (e.g. mask) MA, which is held on the support structure MT. Having traversed the patterning device MA, the radiation beam PB passes through the lens PL, which focuses the beam onto an exposure area C of the substrate W. With the aid of the second positioning device PW and position sensor IF (e.g. an interferometric device), the substrate table WT can be moved accurately, e.g. so as to position different exposure areas C in the path of the radiation beam PB. Similarly, the first positioning device PM and another position sensor (which is not explicitly depicted in FIG. 1a) can be used to accurately position the patterning device MA with respect to the path of the radiation beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the radiation beam PB is projected onto an exposure area C in one go (i.e. a single static exposure). The substrate table WT is then shifted in the X and/or Y direction so that a different exposure area C can be exposed. In step mode, the maximum size of the exposure field limits the size of the exposure area C imaged in a single static exposure.

2. In scan mode, the support structure MT and the substrate table WT are scanned synchronously while a pattern imparted to the radiation beam PB is projected onto an exposure area C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the exposure area in a single dynamic exposure, whereas the length of the scanning motion determines the height (in the scanning direction) of the exposure area.

3. In another mode, the support structure MT is kept essentially stationary holding a programmable patterning device, and the substrate table WT is moved or scanned while a pattern imparted to the radiation beam PB is projected onto an exposure area C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
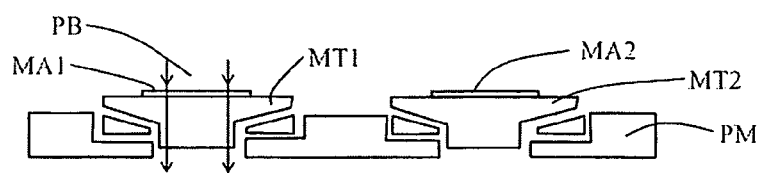

In some instances the lithographic apparatus may be configured to allow more than one pattern to be applied to a given location, the second pattern being projected on top of the first pattern. The first pattern and the second pattern may be identical or substantially the same, although they do not need to be. This is known as double patterning via double exposure. In a typical double exposure, two separate exposures of the same photoresist layer are performed, each exposure using a different patterning device (mask). For example, referring to FIG. 1b, a mask positioner PM is configured to move a first mask table MT1 and associated mask MA1, and a second mask table MT2 and associated mask MA2. The positioner PM positions the first mask MA1 such that the radiation beam PB passes through the first mask MA1 during a first exposure. Following this the positioner PM moves the second mask MA2 in the −x direction so that the radiation beam PB passes through the second mask MA2 during the second exposure. The two patterns add together in the photoresist layer, usually in a manner which provides a combined pattern having a higher resolution than would otherwise be achievable. If a maskless lithography system is used, then a first pattern is present on the programmable mirror array (or other programmable device) for the first exposure, and a second pattern is present on the programmable mirror array (or other programmable device) for the second exposure.

The illuminator IL may comprise a polarizer P configured to adjust the polarization of the radiation beam. It may further comprise an pupil plane distribution adjuster AM configured to adjust the angular intensity distribution of the radiation beam. This may allow adjustment of, for example, the outer and/or inner radial extent (commonly referred to as σ-outer and σ-inner, respectively) of the intensity distribution in a pupil plane of the illuminator. It may also allow selection of different pupil plane distributions, such as annular, dipole or quadrupole. The polarizer P and the pupil plane distribution adjuster AM may be controlled by a controller CT.

In addition, the illuminator IL generally comprises various other components, such as an integrator IN and coupling optics CO. The integrator, which may for example be a quartz rod, improves the homogeneity of the radiation beam.

The distribution of the radiation beam at the illuminator pupil plane (i.e. the pupil plane distribution) is converted to an angular intensity distribution before the radiation beam is incident upon the patterning device (e.g. mask) MA. In other words, there is a Fourier relationship between the pupil plane of the illuminator and the patterning device MA (the patterning device is in a field plane). This is because the illuminator pupil plane substantially coincides with the front focal plane of the coupling optics CO, which focus the radiation beam to the patterning device MA.

Selection of an appropriate pupil plane distribution at the pupil plane may be used to improve the manner in which an image of the patterning device MA is projected onto a substrate W. In particular, pupil plane distributions such as dipole, annular or quadrupole may be used to enhance the resolution with which the pattern is projected, or to improve other parameters such as sensitivity to projection system aberrations, exposure latitude and depth of focus.

In a conventional lithographic system, the polarizer P may comprise a mechanical device which is arranged to add and remove different waveplates from intersection with the radiation beam. For example, the radiation beam may be generated by the source SO with TE polarization. If it is desired to project radiation with TM polarization onto the substrate, then a λ/2 waveplate may be positioned by the polarizer such that it intersects with the radiation beam. This converts the polarization of the radiation beam to TM polarization. When it is desired to return to TE polarization, the λ/2 waveplate is removed from intersection with the radiation beam. The polarizer P may be provided with a plurality of waveplates, each of which may be configured to apply a different polarization to the radiation beam.

In a conventional lithographic system, the pupil plane distribution adjuster AM may comprise a mechanical device which is arranged to add and remove different plates from intersection with the radiation beam at a field plane of the radiation beam. For example, the radiation beam may be generated by the source SO with a disk-shaped pupil plane distribution (often referred to as conventional illumination). If it is desired to project radiation which has a quadrupole mode onto the substrate, then a plate provided with appropriately positioned apertures may be positioned by the pupil plane distribution adjuster such that it intersects with the radiation beam. The pupil plane distribution adjuster may be provided with a plurality of plates, each of which has different apertures. The different plates may therefore be used to apply different pupil plane distributions to the radiation beam.

In a further approach, a plate may, for example, comprise an array of transmissive diffractive optical elements which are arranged to apply a desired angular distribution to the radiation beam. If it is desired to project radiation which has an annular mode onto the substrate, then a plate provided with appropriately configured diffractive optical elements may be positioned by the pupil plane distribution adjuster such that it intersects with the radiation beam. The diffractive optical elements on the plate modify the angular distribution of the radiation beam, and thereby apply an annular pupil plane distribution to the radiation beam. The pupil plane distribution may be provided with a plurality of plates, each of which may be configured to apply a different pupil plane distribution to the radiation beam.

Figure 2:
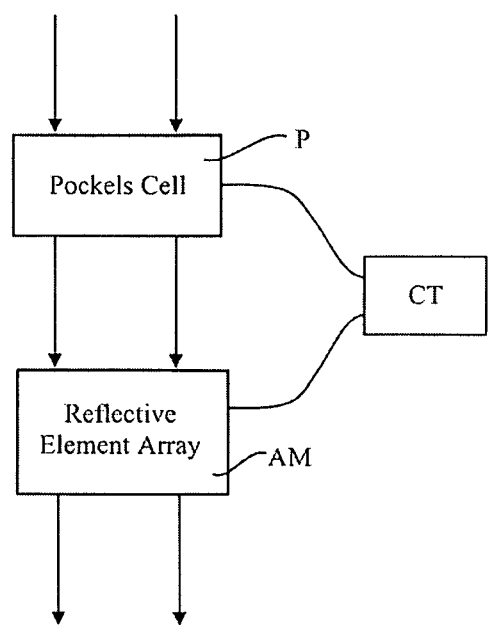
FIG. 2 schematically depicts part of an illumination system of the lithographic apparatus in more detail.

A problem associated with a conventional polarizer and a conventional pupil plane distribution adjuster is that their operation is relatively slow, due to the time required for introduction or removal of a plate. FIG. 2 shows an embodiment of the invention which may overcome this problem or other one or more other problems.

Referring to FIG. 2, which shows part of the illuminator IL of FIG. 1, the polarizer P comprises a Pockels cell and the pupil plane distribution adjuster AM comprises a array of reflective elements.

The Pockels cell adjusts the polarization of the radiation beam in response to a voltage which is applied across it. A change of the polarization state of the radiation beam may be achieved using the Pockels cell much more rapidly than would be possible via the conventional introduction and/or removal of a waveplate.

The array of reflective elements adjusts the pupil plane distribution of the radiation beam by adjusting the orientation of the reflective elements of the array such that they apply a desired angular distribution to the radiation beam. A change of the pupil plane distribution of the radiation beam may be achieved using the array of reflective elements much more rapidly than may be possible using a conventional plate-based pupil plane distribution adjuster.

The combination of the Pockels cell and the array of reflective elements allows faster and coordinated control of the polarization state and the pupil plane distribution of the radiation beam. This allows switching between polarization specific pupil plane distributions, as will be described further below. The polarization of the radiation and the pupil plane distribution of the radiation are sometimes referred to in combination as being the illumination mode of the radiation.

The Pockels cell uses voltage-controlled birefringence to act as a waveplate. The Pockels cell may for example comprise one or more lithium niobate crystals or crystalline quartz crystals. A voltage may be applied to the Pockels cell by the controller CT. The Pockels cell may be arranged such that when the voltage has a first value the polarization of the radiation beam is unaffected (e.g. the radiation beam remains TE polarized), and when the voltage has a second value the polarization of the radiation beam is rotated (e.g. the radiation beam is TM polarized). Intermediate voltage values may be selected for example to obtain polarizations which are linear but which are between TE and TM polarizations. The Pockels cell may provide switching between polarization states with a speed of, for example, 10 nanoseconds.

The manner in which the array of reflective elements is used to adjust the pupil plane distribution of the radiation beam will be explained in relation to FIGS. 3 to 6.

Figure 3:
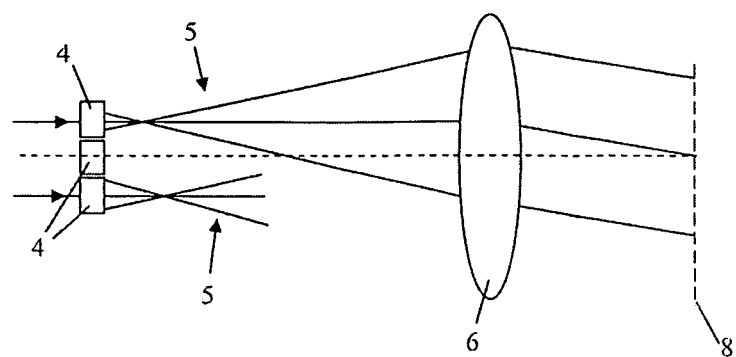
FIG. 3 schematically illustrates the transformation of an angular intensity distribution to a spatial intensity distribution.

FIG. 3 schematically illustrates the principle of corresponding angular and spatial intensity distributions of a radiation beam. In a conventional arrangement the pupil plane distribution of the radiation beam may be set using a plate having an array of diffractive elements 4. Each diffractive element 4 forms a divergent pencil 5 of rays. Each pencil 5 of rays corresponds to a part or sub-beam of the radiation beam PB. The pencils 5 will be incident at a focusing lens 6. In the back focal plane 8 of the focusing lens 6, each pencil 5 corresponds to an illuminated area. The size of the area depends on the range of directions into which the rays of the pencil 5 propagate. If the range of directions is small, the size of the illuminated area in the back focal plane 8 is also small. If the range of directions is large, the size of the illuminated area in the back focal plane 8 is also large. Furthermore, all identical directions of the pencils 5, i.e. all rays which are parallel to each other, correspond to the same particular point in the back focal plane 8 (provided that ideal optical conditions apply).

Figure 5:
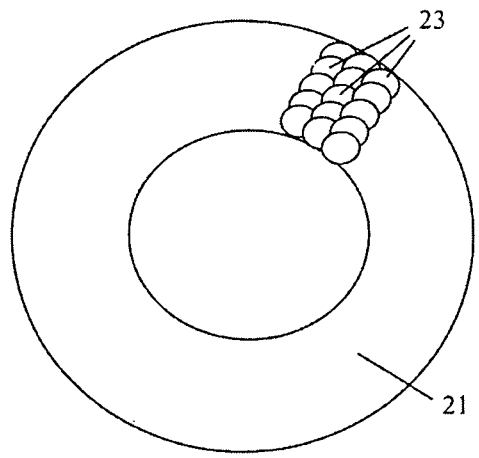
FIG. 5 depicts a spatial intensity distribution in a pupil plane.

It is known to produce a spatial intensity distribution in a cross-section of the radiation beam PB (in particular in a pupil plane of the radiation beam) which has an annular shape (i.e. an annular pupil plane distribution). An example of this annular shape is illustrated in FIG. 5 by two concentric circles. The inner radial extent (σ-inner) of the annular shape corresponds to the central area with an intensity of zero or close to zero, and can be set by using an appropriate array of diffractive optical elements. For example, referring to FIG. 3 an array of diffractive elements 4 can be selected which is configured such that none of the pencils 5 of rays will be incident at the central area, and will instead only be incident in the annular area (although in practice, there may be an intensity greater than zero in the central area, due to effects such as dispersion). By appropriate selection of the diffractive elements 4, other spatial intensity distributions can be produced in the cross-sectional area, such as dipole or quadrupole illumination. Additional optical elements (not illustrated) such as a zoom lens or an axicon may be used to apply further modifications to the angular distribution of the radiation beam.

Figure 4:
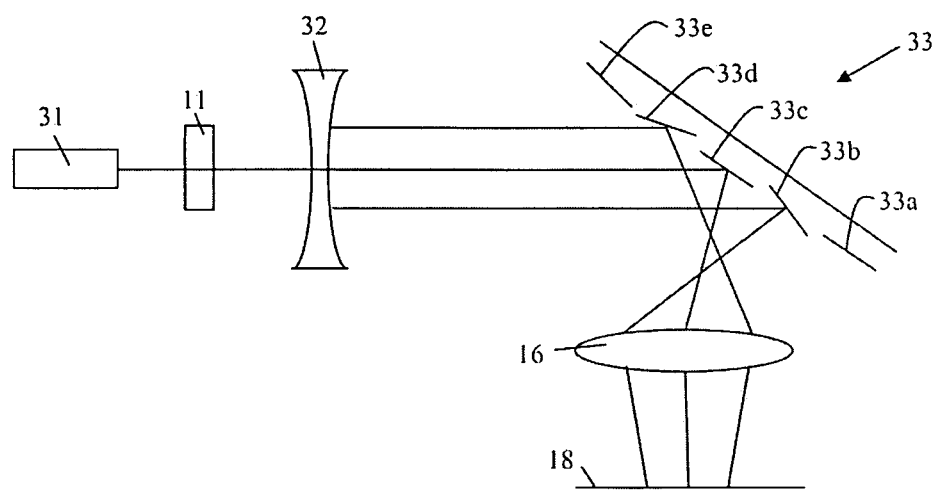
FIG. 4 schematically illustrates in more detail part of the lithographic apparatus shown in FIG. 1.

FIG. 4 schematically shows an array 33 of individually controllable reflective elements which are used to select the pupil plane distribution. A source 31 (equivalent to LA in FIG. 1) outputs a relatively narrow, collimated radiation beam which passes through a shutter 11. The radiation beam then passes through beam divergence optics 32 which expand the beam to a size which corresponds to the size of the array 33 of reflective elements 33a-e. The radiation beam divergence optics 32 may output a collimated beam. The size of the expanded radiation beam may be sufficient that the radiation beam is incident on all of the reflective elements 33a-e. In FIG. 4, by way of example, three sub-beams of the expanded radiation beam are shown.

A first sub-beam is incident at one of the reflective elements 33b. Like the other reflective elements 33a, 33c-e of the array 33, the reflective element 33b can be controlled to adjust its orientation so that the sub-beam is reflected in a desired certain direction. Redirecting optics 16, which may comprise a focusing lens, redirect the sub-beam so that it is incident at a desired point or area in a cross-sectional plane 18 of the radiation beam. The cross-sectional plane 18 may coincide with a pupil plane, which acts as a virtual radiation source for other parts of the illuminator (not shown in FIG. 4). The other sub-beams shown in FIG. 4 are reflected by the reflective elements 33c, 33d and redirected by redirecting optics 16 so as to be incident at other points of plane 18. By controlling the orientations of the reflective elements 33a to 33e, almost any spatial intensity distribution in the cross-sectional plane 18 can be produced.

Although FIG. 4 shows only five reflective elements 33a-e, the array 33 may comprise many more reflective elements, for example arranged in a two-dimensional grid. For example, the array 33 may comprise 1024 (e.g. 32×32) mirrors, or 4096 (e.g. 64×64) mirrors, or any other suitable number of mirrors. More than one array of mirrors may be used. For example a group of four mirror arrays having 32×32 mirrors may be used. The term 'array' in this description may mean a single array or a group of mirror arrays.

FIG. 5 shows a spatial intensity distribution in a pupil plane which may be produced by the illuminator of the lithographic apparatus. FIG. 5 may be understood as a schematic diagram which illustrates the principle of producing a spatial intensity distribution using a plurality of sub-beams. The drawing plane of FIG. 5 coincides with a cross-section of the radiation beam, for example, the cross-sectional plane 18 of FIG. 4. FIG. 5 depicts an annular pupil plane distribution 21, and shows fifteen circular areas 23 representing sub-beams of the radiation beam, each of which has been directed by a different reflective element. The sub-beams of radiation form the annular pupil plane distribution. Although only fifteen circular areas 23 are shown in FIG. 5, this is for ease of illustration (in practice the circular areas would fill the annular mode 21).

Since the sub-beams of the radiation beam can be directed to any desired location in the cross-sectional area, almost any intensity profile can be produced. It is possible for example to produce what could be considered to be conventional pupil plane distributions, e.g. with annular mode, dipole mode, quadrupole mode, etc. The controller CT controls the orientation of the reflective elements, and thereby determines which illumination is applied to the radiation beam.

Figure 6:
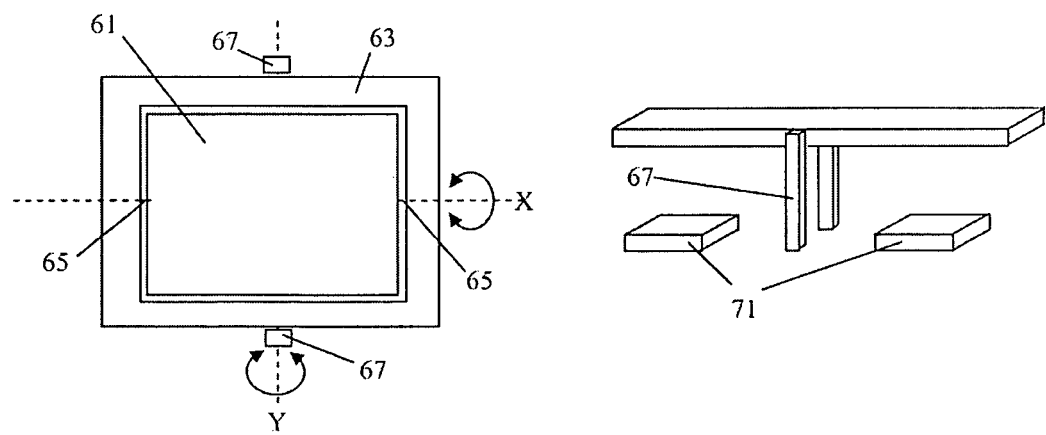
FIG. 6 schematically illustrates a mirror of an array of reflective elements which may form part of the lithographic apparatus shown in FIG. 1.

FIG. 6 shows schematically an example of a reflective element, which may for example form part of the array of reflective elements shown schematically in FIG. 4. The array of reflective elements may comprise, for example, more than 1000 of such reflective elements, which may, for example, be arranged in a grid-like formation in a plane which intersects the radiation beam. The reflective element shown in FIG. 6 is viewed from the top on the left side of FIG. 6 and in a perspective view on the right side of FIG. 6. For ease of illustration some of the detail shown in the top view in FIG. 6 is not included in the perspective view of FIG. 6. The reflective element comprises a mirror 61 with a rectangular reflective surface area. In general, the mirror can have any desired shape, for example square, rectangular, circular, hexagonal, etc. The mirror 61 is connected to a support member 63 via a rotational connection 65. The mirror 61 may be rotated with respect to the support member 63, the rotation being around a first axis X (indicated by a dashed line). The support member 63 is rotationally connected to legs 67 which are supported by a substrate (not shown). The support member may be rotated around a second axis Y (indicated by a dashed line). It is therefore possible to orientate the mirror 61 in directions which involve a combination of X-axis and Y-axis rotations.

The orientation of the mirror 61 may be controlled by the controller CT using electrostatic actuators 71. The electrostatic actuators 71 comprise plates to which certain charges are applied. The charges attract the mirror 61 via electrostatic attraction, and are varied to adjust the orientation of the mirror. One or more sensors may be provided to give feedback control of the orientation of the mirror 61. The sensor(s) may, for example, be an optical sensor, or may for example be a capacitive feedback sensor. The plates which are used as electrostatic actuators may also act as the capacitive feedback sensors. Although two electrostatic actuators 71 are shown in FIG. 6, more or less than two may be used. Any other suitable form of actuator may be used. For example, one or more piezo-electric actuators may be used.

The orientation of the mirror 61 can be adjusted so as to reflect an incident radiation beam into any desired direction of a hemisphere. Further details concerning reflective elements of the type shown in FIG. 6, and of other types, are disclosed in for example U.S. Pat. No. 6,031,946.

The array of reflective elements may allow switching between pupil plane distributions to be achieved more quickly than would be the case if a plate-based pupil plane distribution adjustment were to be used. The switching is controlled by the controller CT.

The combination of the Pockels cell and the reflective element array pupil plane distribution adjuster allows exposure of a substrate to be performed in a manner which was not achievable using a conventional lithographic apparatus (or which was difficult or impractical to achieve). For example, radiation having a quadrupole pupil plane distribution with TE and TM polarization in different poles (shown in FIG. 7a) may be projected onto a substrate.

Figure 7A:
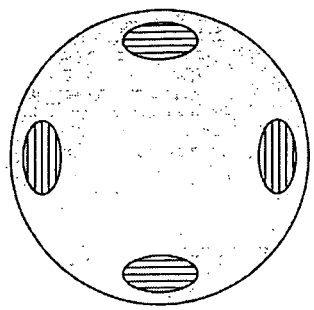
FIGS. 7a to 7c schematically depict a combination of polarization and pupil plane distribution obtained using an embodiment of the invention.
Figure 7B:
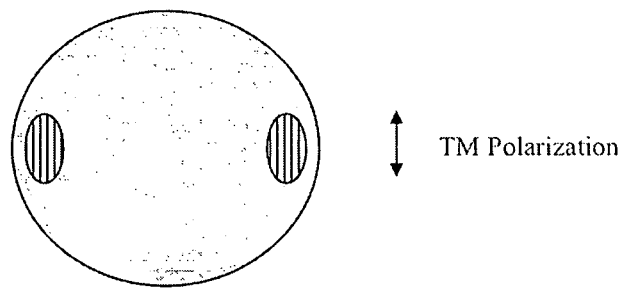
Figure 7C:
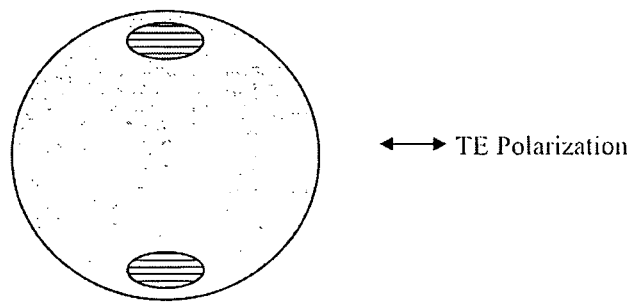

This may be achieved for example by configuring the reflective element array such that a first dipole pupil plane distribution shown in FIG. 7b is formed, and applying an appropriate voltage to the Pockels cell such that the radiation beam is TM polarized. Following a certain period of time the configuration of the reflective element array may be adjusted such that the second dipole pupil plane distribution shown in FIG. 7c is formed, and the voltage to the Pockels cell may be adjusted such that the radiation beam is TE polarized. Once that period of time has again elapsed, the configuration of the reflective element array and the Pockels cell may be adjusted such that the first dipole pupil plane distribution and TM polarization is again provided. Switching between the modes and polarizations shown in FIGS. 7b and 7c may be performed a plurality of times. This may be done such that the substrate receives the quadrupole pupil plane distribution and polarization combination shown in FIG. 7a.

In the quadrupole pupil plane distribution of FIG. 7a, the polarization of each pole is substantially perpendicular to a radial line which extends from the optical axis to that pole. This may provide improved imaging performance compared with a quadrupole pupil plane distribution in which the polarization is the same in each pole (as may generally be seen in the prior art).

Figure 8:
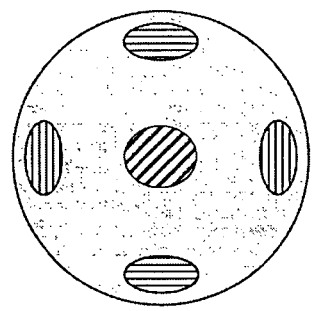
FIGS. 8 and 9 schematically depict further combinations of polarization and pupil plane distribution obtained using an embodiment of the invention.
Figure 9:
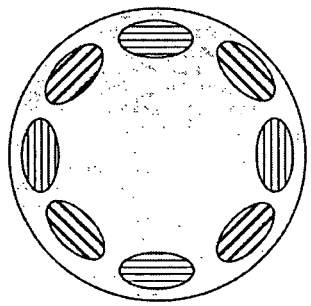

Other example combinations of polarization and pupil plane distribution may be achieved using an embodiment of the invention. For example, as shown in FIG. 8, additional radiation may be provided at the center of the mode. This may have any desired polarization, for example a linear polarization which is between TE and TM. In an alternative example, shown in FIG. 9, an octupole pupil plane distribution may be obtained in which each pole has a polarization which is substantially perpendicular to a radial line extending from the optical axis to that pole. In the case of the FIG. 9 illumination mode, the radiation beam may be switched between four dipole pupil plane distributions, each mode having a different polarization, to form the FIG. 9 illumination mode. Other combinations of TE, TM, or other polarizations, together with other pupil plane distributions may be achieved.

The certain period of time during which the pupil plane distribution and polarization are set to a particular combination (e.g. the combination shown in FIG. 7b) may be any suitable period. For example, if the radiation source SO is a pulsed source, the period of time may be such that the pupil plane distribution and polarization are switched after each pulse of radiation. For example the time delay between pulses of the radiation source may be 250 microseconds, and both the Pockels cell and the reflective element array may be arranged to switch during this time (i.e. switch between voltages applied to the Pockels cell and switch between configurations of the reflective element array). Alternatively, the period of time may be such that a series of pulses is emitted by the radiation source before switching occurs. For example, 60 pulses may have applied to them the pupil plane distribution and polarization shown in FIG. 7b, and the next 60 pulses may have applied to them the pupil plane distribution and polarization shown in FIG. 7c, and so on. In a further example, switching may occur after 5 pulses. Switching may, for example, occur after any number of pulses, or after any period of time.

Switching between polarization states and pupil plane distributions may be controlled by the controller CT. The controller CT may coordinate the switching. The switching may be synchronized, or substantially synchronized, such that the polarization state and the pupil plane distribution switch at the same time or at substantially the same time. For example the controller may initiate switching of both the polarization state and the pupil plane distribution at the same time. Where this is done, it is likely that the switch of the polarization state may be completed before the switch of the pupil plane distribution (the Pockels cell will likely switch more quickly than the array of reflective elements will move). Alternatively, the controller may initiate switching of the pupil plane distribution before initiating switching of the polarization state. For example, this may be done in such a way that the switching of pupil plane distribution is completed at the same time or substantially the same time that the switching of polarization state is completed.

It may be desired to ensure that the certain period of time between switching is sufficiently short that a given location on the substrate receives each combination of pupil plane distribution and polarization. Alternatively, it may be desired to direct a first combination of pupil plane distribution and polarization at a first location on the substrate, and to direct a second combination of pupil plane distribution and polarization at a second location on the substrate. For example, a first portion of an exposure area (e.g. a die) may receive a first combination of pupil plane distribution and polarization, and a second portion of the exposure area may receive a second combination of pupil plane distribution and polarization. Alternatively, the first portion of the exposure area may receive first and second combinations of pupil plane distribution and polarization, and the second portion of the exposure area may receive a third combination of pupil plane distribution and polarization (or the first combination, or the second combination). These various combinations may be achieved, for example, when the lithographic apparatus is a scanning lithographic apparatus.

An embodiment of the invention may be used in combination with double patterning via double exposure (described further above in relation to FIG. 1). Where this is the case, it may be desired to use a pupil plane distribution and polarization for the second exposure which is different to the pupil plane distribution and polarization which is used for the first exposure. As such, an embodiment of the invention may be used to switch between pupil plane distributions and polarization states during the time taken to switch between the first mask and second mask. If a maskless lithography system is used, then an embodiment of the invention may be used to switch between pupil plane distributions and polarization states during the time taken to switch between the first pattern and the second pattern on the programmable mirror array.

Although switching of the Pockels cell will almost certainly be sufficiently fast so as to be achieved between radiation pulses, it may be the case that switching of the reflective element array may not be achieved between pulses. Where this is the case, one or more pulses of radiation may be incident upon the reflective array when it is in an intermediate state. A pattern provided on the patterning device (e.g. a reticle) in the lithographic apparatus may be designed to take into account that some radiation in an intermediate pupil plane distribution state may be incident upon it.

Embodiments of the invention have been described above in relation to an array of reflective elements. This may comprise an array of mirrors, and array of diffractive elements, or any other suitable array. The elements may be individually controllable.

While specific embodiments of the invention have been described above, it will be appreciated that the invention may be practiced otherwise than as described. The description is not intended to limit the invention.

The invention claimed is:

1. A lithographic apparatus comprising:
an illumination system configured to condition a beam of radiation, the illumination system comprising a Pockels cell arranged to control the polarization of the radiation beam, and an array of individually controllable reflective elements arranged to control the pupil plane distribution of the radiation beam;
a support structure configured to support a patterning device, the patterning device arranged to impart the radiation beam with a pattern in its cross-section;
a substrate table configured to hold a substrate
a projection system configured to project the patterned radiation beam onto the substrate; and
a controller configured to control the Pockels cell to change the polarization of the radiation beam between at least two different polarizations during a particular single shot or scan of the patterned radiation on the substrate and to allow the at least two different polarizations of the radiation beam to reach the array of individually controllable reflective elements during the particular single shot or scan of the patterned radiation on the substrate, such that the at least two different polarizations impinge a same area of the substrate before a next substantial movement thereafter of the substrate.

2. The apparatus of claim 1, further comprising a controller configured to operate the Pockels cell and the array of individually controllable reflective elements.

3. The apparatus of claim 2, wherein the controller is configured to coordinate operation of the Pockels cell and the array of individually controllable reflective elements.

4. The apparatus of claim 1, wherein the array of individually controllable reflective elements comprises an array of mirrors.

5. The apparatus of claim 1, wherein the controller is configured to switch from a first polarization of the at least two polarizations and a first pupil plane distribution to a second polarization of the at least two polarizations and a second pupil plane distribution during exposure of an exposure area on the substrate.

6. The apparatus of claim 5, wherein the beam of radiation is pulsed, and the controller is configured to switch the polarization and pupil plane distribution after each pulse of the radiation beam.

7. The apparatus of claim 5, wherein the beam of radiation is pulsed, and the controller is configured to switch the polarization and pupil plane distribution after a number of pulses selected from the range of about 5 pulses to about 60 pulses.

8. The apparatus of claim 5, wherein the beam of radiation is switched between two dipole pupil plane distributions, each pupil plane distribution having a different polarization.

9. An illumination system of a lithographic apparatus comprising a Pockels cell arranged to control polarization of a radiation beam, an array of individually controllable reflective elements arranged to control the pupil plane distribution of the radiation beam, and a controller configured to control the Pockels cell to switch substantially all the radiation directed to the same array of individually controllable reflective elements to only a single polarization of the radiation beam and then to only a single different polarization of the radiation beam so as to produce a pupil plane distribution having at least two different polarizations, such that the at least two different polarizations impinge a same area of the substrate before a next substantial movement thereafter of the substrate.

10. A lithographic method, comprising:
providing a beam of radiation;
modifying the polarization of the radiation beam using a Pockels cell to at least two different polarizations;
applying a pupil plane distribution to the beam of radiation using an array of individually controllable elements;
patterning the radiation beam using a patterning device; and
projecting the patterned radiation beam onto a substrate using a projection system; and
switching substantially all the radiation directed to the same array of individually controllable reflective elements between the at least two different polarizations of the radiation beam during a particular single shot or scan of the patterned radiation on the substrate so as to produce a pupil plane distribution having at least two different polarizations, such that the at least two different polarizations impinge a same area of the substrate before a next substantial movement thereafter of the substrate.

11. The method of claim 10, wherein the switching comprises switching from a first polarization of the at least two different polarizations and a first pupil plane distribution to a second polarization of the at least two different polarizations and a second pupil plane distribution during exposure of an exposure area on the substrate.

12. The method of claim 11, further comprising switching back from the second polarization and second pupil plane distribution to the first polarization and first pupil plane distribution during exposure of the exposure area.

13. The method of claim 11, further comprising switching to a third polarization and third pupil plane distribution during exposure of the exposure area.

14. The method of claim 11, wherein the beam of radiation is pulsed, and the switching of polarization and pupil plane distribution occurs after each pulse of the radiation beam.

15. The method of claim 11, wherein the beam of radiation is pulsed, and the switching of polarization and pupil plane distribution occurs after a certain number of pulses of the radiation beam.

16. The method of claim 11, wherein the switching of polarization and pupil plane distribution is arranged such that a first part of the exposure area receives radiation having the first polarization and first pupil plane distribution and a second part of the exposure area receives radiation having the second polarization and second pupil plane distribution.

17. The method of claim 11, wherein the switching from the first polarization to the second polarization is substantially synchronized with the switching from the first pupil plane distribution to the second pupil plane distribution.

18. The method of claim 11, further comprising performing double patterning via double exposure, and the switching of polarization and pupil plane distribution occurs after patterning the radiation beam using a first pattern and before patterning the radiation beam using a second pattern.

19. The method of claim 11, wherein the radiation beam is switched between two dipole pupil plane distributions, each pupil plane distribution having a different polarization.

20. The method of claim 11, wherein the radiation beam is switched between four dipole pupil plane distributions, each mode having a different polarization.

* * * * *